United States Patent
Zeitner et al.

(10) Patent No.: US 6,920,160 B2
(45) Date of Patent: Jul. 19, 2005

(54) LASER RESONATORS COMPRISING MODE-SELECTIVE PHASE STRUCTURES

(75) Inventors: Uwe Detlef Zeitner, Weimar (DE); Reiner Guether, Berlin (DE)

(73) Assignee: Fraunhofer-Gesellschaft Zur Foerderung der Angewandten Forschung E.V., Munich (DE)

( * ) Notice: Subject to any disclaimer, the term of this patent is extended or adjusted under 35 U.S.C. 154(b) by 79 days.

(21) Appl. No.: 10/311,184

(22) PCT Filed: Jun. 15, 2001

(86) PCT No.: PCT/EP01/06806

§ 371 (c)(1),
(2), (4) Date: Apr. 4, 2003

(87) PCT Pub. No.: WO01/97349

PCT Pub. Date: Dec. 20, 2001

(65) Prior Publication Data

US 2003/0147445 A1 Aug. 7, 2003

(30) Foreign Application Priority Data

Jun. 15, 2000 (DE) .......................... 100 29 402

(51) Int. Cl.⁷ ............................... H01S 3/13
(52) U.S. Cl. .................... 372/29.023; 372/50
(58) Field of Search ............ 372/20, 90, 92–109, 372/22, 29.02, 75, 29.023, 29.022, 40, 41, 30–32, 43–54

(56) References Cited

U.S. PATENT DOCUMENTS

| 4,873,788 A | 10/1989 | Viramontes |
| 5,033,054 A | 7/1991 | Scifres et al. |
| 5,173,914 A | 12/1992 | Kokubo |
| 5,272,711 A | 12/1993 | Mawst et al. |
| 5,272,714 A | 12/1993 | Chen et al. |

FOREIGN PATENT DOCUMENTS

| DE | 42 12 153 A1 | 10/1993 |
| DE | 43 22 163 A1 | 1/1995 |

OTHER PUBLICATIONS

Fox, A.G. and Tingye, Li; Resonant Modes in an Maser Interferometer; The Bell System Technical Journal, pp. 453–488; Mar. 1961.
Journal of Technical Physics. vol. 34, pp. 193–204.
Beck, Mason; Fish, Greg, Denbaars and Coldren, Larry; Ridge Waveguide Sampled Grating DBR Lasers with 22–nm Quasi–Continuous Tuning Range, IEEE Photonics Technology, vol. 10,No. 9, Sep. 1998.
Takiguchi, Tohru, et al., Selective–Area Growth for Novel 1.3 •m Distributed Feedback Laser Diodes with Graded Grating, Japanese Board of Applied Physics, vol. 38 (1999) pgs pp. 1249–1251.
Oku, S., et al., Fabrication And Performance Of Surface–Grating Distributed Bragg Reflector Lasers With Grooved Surface Gratings Formed By Reactive Beam Etching, IEE Proc.–Opto–electron, vol. 146, No. 1, Feb. 1999.
Patent Abstract of Japan, Mar. 8, 1990, Tsunekawa.

*Primary Examiner*—Minson O Harvey
*Assistant Examiner*—Tuan N. Nguyen
(74) *Attorney, Agent, or Firm*—Marshall & Melhorn, LLC (57) ABSTRACT

The invention relates to a laser resonator for semiconductor lasers having a waveguiding layer which is disposed between a substrate and a superstrate, the waveguiding layer, the substrate and/or the superstrate of the laser resonator having at least one phase structure which varies locally in such a manner that at least one predetermined laser mode is influenced in its propagation characteristic.

33 Claims, 10 Drawing Sheets

LASER RESONATORS COMPRISING MODE-SELECTIVE PHASE STRUCTURES

BACKGROUND OF THE INVENTION

The present invention relates to a laser resonator for semiconductor lasers, as are used in particular in information technology and telecommunications and also in laser material processing.

In the field of information technology and telecommunications, semiconductor lasers are used in order to transmit signals for example in glass fibres. It is necessary thereby to focus the radiation to be coupled into a monomode fibre in diffraction-limited spots in order to achieve an efficient coupling. Energy-rich, diffraction-limited spots are striven for also in the field of laser material processing in order to make possible highly precise cutting and welding of the most varied materials.

There exist various possibilities in the state of the art for the production of monochromatic laser radiation with high energies by means of semiconductor lasers. These can be divided roughly into laser diode bars, laser diode stacks, broadband laser diodes or trapeze lasers.

Laser diode bars concern a number of individual laser diode structures which are located next to each other on a semiconductor laser substrate. The semiconductor substrate comprises a multilayer arrangement of different composition, the laser radiation being produced in one of the layers. This layer acts simultaneously for the produced laser light as layer waveguide which operates only one single vertical transverse mode via the layer thickness. In the layer plane, no spatial restriction of the waveguiding region is generally effected in the case of laser diode bars which leads to the produced laser light of a single emitter being strongly multimode in this direction. Between the individual emitters of such a laser diode bar there exists in general likewise no firm phase relationship of the produced laser beams so that the radiation of such a bar via the radiated face is spatially incoherent. A single bar is however able to radiate several 10W of optical power.

In order to achieve a further increase in the optical power, a plurality of laser diode bars is stacked one above the other so as to form so-called laser diode stacks, as a result of which optical total powers in the kW range are achieved. In addition, the concept of broadband single lasers exists furthermore, as high powers as possible being achieved to above the 10W range with band widths around 200 $\mu$m. The lateral radiation is however also extremely multimode in the case of broadband laser diodes.

In the case of the so-called trapeze lasers, a monomode radiation in a narrow band of a "master oscillator" is produced which is then coupled in an almost trapezoidal "power amplifier" range, which is optimised in its formation, and is amplified there. The hence achievable powers are around 2W. The available surface area of the laser band available for the amplification is thereby however not fully exploited for reasons of principle.

The development of Z-lasers started in F. Herrera, J. L. Verdegay, Genetic Algorithms and Soft Computing (Studies in Fuzziness and Soft Computing Vol. 8), Physica-Verlag Heidelberg, (1996), L. A. Vainstein, Diffrakzija v othkrytich resonatorach i otkrytych bolnovodach s ploskoimi zerkalami (Russian), Diffraction in open resonators and open waveguides with flat mirrors, Shurnal technitscheskoj fiziki (Journal for Technical Physics), Vol. 34, 193–204 (1964), is based on the angle selectivity during reflection in the limit range for total reflection. The power up till now has been 500 mW and the angle selectivity is approximately 2°. In addition to this selection angle there is a mode width of 35 $\mu$m which is expedient for diffraction-limited emission. An increase in the band width to be implemented for the purposes of increasing power to for example 200 $\mu$m permits no diffraction-limited emission in the case of a constant selection angle.

There exists in general in a laser resonator of a semiconductor laser, for example in a laser diode, a set of electromagnetic field distributions which are again completely reproduced during their propagation after a complete circulation in the resonator in intensity and phase up to a constant factor $\gamma$ and hence exist in a stationary manner in the resonator. These discrete field distributions are called modes. In a laser, generally all the modes will oscillate during the laser operation, the circulating losses V of which, $V=1-\gamma^2$ applying, being smaller than a value $V_{max}$, designating thereby the so-called laser threshold, which is dependent predominantly upon the pump arrangement and in the active laser material.

If a laser oscillates only with the mode which has the lowest circulating losses then this is described as a monomode laser operation. This mode with the lowest circulating losses of the resonator is also called fundamental mode. During simultaneous oscillation of the laser with a plurality of modes this is described as multimode operation. The circulating losses of the individual laser modes are determined thereby by the resonator geometry, such as for example the optical elements in the resonator, by the resonator mirror, the apertures and geometric tolerances. By means of appropriate choice of this geometry, the circulating losses of the individual modes can be influenced specifically.

In semiconductor lasers, especially in broadband laser diodes and laser diode bars, the resonator geometry is given however by the width of the active, waveguiding layer and the resonator mirrors which are formed by the facets. The relatively large width of the active region in the case of semiconductor lasers in comparison to its length permits however a very large number of transverse modes to perform one resonator circulation with low losses so that semiconductor lasers in general operate in multimode operation without particular measures.

In all of the described variants of the semiconductor lasers, either their low power or the spatial incoherence of the produced laser radiation, which prevents effective focusing of the light in small spots, is consequently disadvantageous.

Methods are known from the literature for selection of individual longitudinal modes for frequency stabilisation of semiconductor lasers, for example by applying so-called Bragg gratings made of periodic refractive index distributions along the resonator axis on the laser chip. This is known for example from DE 43 22 163 A1. A selection of lateral laser modes is however not thereby effected since these Bragg gratings serve only for frequency stabilisation of the lasers.

SUMMARY OF THE INVENTION

It is the object of the present invention to indicate a laser resonator for semiconductor lasers, with which laser radiation with only one lateral mode in the waveguide plane or only a few lateral laser modes can be produced. Furthermore, it is the object of the present invention to indicate a method for producing a laser resonator of this type.

This object is achieved by the laser resonator according to claim 1 and by the method according to claim 20. Advantageous developments of the laser resonator according to the invention and also of the production method according to the invention are given in the respective dependent claims.

According to the state of the art, the circulating losses of individual modes are influenced by appropriate choice of the geometry of the resonator. This concerns in particular the choice of the dimensions of the resonator and the choice and arrangement of the further optical elements of the semiconductor laser.

Fundamental to the present invention is the knowledge that the propagation characteristic of individual lateral modes in the waveguiding layer can be influenced by the fact that, as fundamental mode, such a mode is provided with a strongly laterally structured wavefront/phase.

Between this thus formed fundamental mode and the respective facets there are disposed, according to claim 1, respectively one phase-conjugating holographic element formed by specific distribution of the effective refractive index of the layer.

Precisely the strongly lateral wavefront/phase structure of the fundamental mode, in cooperation with the phase-conjugating effective refractive index structures, which are cited further on in the text with the abbreviation "phase structures", offers the possibility of achieving a high discrimination with respect to the circulating losses between the fundamental mode and the excited undesired modes so that the latter modes cannot oscillate.

Furthermore, the phase structure can be formed advantageously for example in the vicinity of both facets respectively so that its effect on the fundamental mode is compensated for mutually so that only the circulating losses of all modes apart from the fundamental mode increase extremely due to diffraction and absorption. The circulating losses of the fundamental mode are however not affected. This property leads consequently to the fact that the fundamental mode in the resonator can circulate with very small losses. Since the condition, that the influence of both phase structures on the propagation characteristic of the mode is compensated for mutually, is very strongly dependent upon the intensity distribution of the fundamental mode in the case of an appropriate calculation of these structures, it is not usually fulfilled for the other modes of the resonator, which then leads to very high circulating losses for these modes. If these losses rise above $V_{max}$, then the laser operates as a result in monomode in the fundamental mode.

By means of the laser resonator according to the invention and the phase structures according to the invention, a semiconductor laser can consequently be produced which has a monochromatic radiation of high energy and high "brightness", in particular with great spatial coherence, i.e. with a small beam quality factor $M^2$ near 1. It is hence possible to focus this radiation in diffraction-limited spots and to implement an efficient coupling in monomode fibres, for example in information technology and telecommunications. Even the production of energy-rich, diffraction-limited spots, for example for laser material processing, in particular for highly precise cutting and welding of the most varied materials, is possible in a simple manner by means of the laser resonator according to the invention.

The production of the necessary phase structures is effected in an advantageous manner by a specific change in the local properties of substrate, superstrate (these are the two layers which include the layer waveguide above and below) and/or the active waveguiding layer. For this purpose, the effective refractive index in the waveguide can be changed, which depends inter alia upon the thickness of the waveguide and upon the refractive index of the waveguide itself and also upon the refractive indices of its neighbouring layers, the substrate and the superstrate. An active zone with for example a "quantum well" and with a thickness of 10 nm thereby influences the effective refractive index in the waveguide only unsubstantially.

The effective refractive index in the waveguide can be influenced advantageously by a locally varying thinning of the waveguide and thus a defined phase structure can be produced via defined thinnings. During their propagation through the waveguide, the modes corresponding to this phase structure are then influenced in their propagation characteristic, the mode properties, in particular the circulating losses, being able to be correspondingly adjusted by means of suitable methods. It is advantageous in the laser resonator according to the invention that no lateral restrictions of the active waveguide range are required in order to achieve a monomode operation. Scaling and application of the method even in the range of high output powers of semiconductor laser diodes is consequently possible.

The production of the necessary phase structures is effected for example by microstructuring of the thickness of waveguide, substrate or superstrate, for example with conventional lithographic methods as are known from semiconductor chip manufacturing. The simultaneous structuring of the semiconductor lasers is thereby possible already on the wafer scale. For small variations $\Delta n$ of the effective refractive index n with $\Delta n/n<0.1$ in the mentioned phase-conjugating holographic elements, the effective extension of these elements is increased in the beam propagation direction to $>\lambda/\Delta n$, $\lambda$ being the wavelength of the mode to be amplified in air. The optical effect on the wavefronts of the resonator modes should thereby not be calculated by the simple optical path length on a path parallel to the resonator axis but with a wave optical beam propagation method, such as for example the known beam propagation method (BPM).

Within the longitudinal range indicated by the effective thickness $\lambda/\Delta n$ there occurs advantageously a longitudinal variation of the effective refractive index which can be calculated via the said wave propagation.

The longitudinal variation can thereby be approximated by a binary pattern of alternately two effective refractive indices, the use of a binary pattern greatly simplifying the calculation of the beam propagation and the production of the laser resonator.

The calculation of the effective refractive index distribution of the phase structures is effected by a step-wise propagation of the field distributions of the laser mode to be amplified by the respective element, a region with reduced effective refractive index being disposed after each step at the positions at which the phase values of the then current field distribution are smaller than the average of all phase values.

The mentioned strongly lateral modulation of the wavefront p (x) of the electrical field of the fundamental mode, with the amplitude distribution A (x) in the direction x perpendicular to the resonator axis $$U(x,z)=A(x)\cdot\exp(i\cdot p(x))$$

in the resonator cross-section of the effective refractive index distribution close to the light outlet facet of the resonator is formed such that it is described with a function p(x) with at least five non-identical turning points, the minimal phase deviation between adjacent turning points being $0.1\,\pi$.

Furthermore, it is possible advantageously to deflect the path of the laser mode to be amplified between the two end facets with a predisposed effective refractive index distribution by a plurality of mirrors introduced effectively into the surface of the waveguide. These mirrors can be produced by a channel with a width of the multiple of the light wavelength and with high effective refractive index difference in total reflection. By means of a locally partial impeding of the total reflection by a locally varying channel width, a Gaussian apodisation of the mirror reflection can be achieved.

The effective mirrors can also comprise Bragg gratings in transmission or reflection with an incidence angle different from the perpendicular incidence towards the direction of the grating channels.

Advantageous embodiments of the laser resonator according to the invention provide a non-periodic function as function p(x) of the laser mode to be amplified. This can be in addition a band-width limited random function, i.e. the maximum occurring local frequencies f of the function p(x) are smaller than a maximum frequency $f_{max}$.

In order to produce the phase-conjugating holographic elements, the properties both of the waveguiding layer and of the substrate or superstrate can be locally varied. In particular the thickness and/or the refractive index of the respective layer are thereby suitable as properties. It is particularly advantageous if the thickness of the waveguiding layer is locally reduced in order to produce the phase-conjugating holographic elements.

BRIEF DESCRIPTION OF THE DRAWINGS

A few examples of laser resonators according to the invention and production methods according to the invention are intended to be presented in the following.

There are shown

DESCRIPTION OF THE PREFERRED EMBODIMENTS

Figure 1:
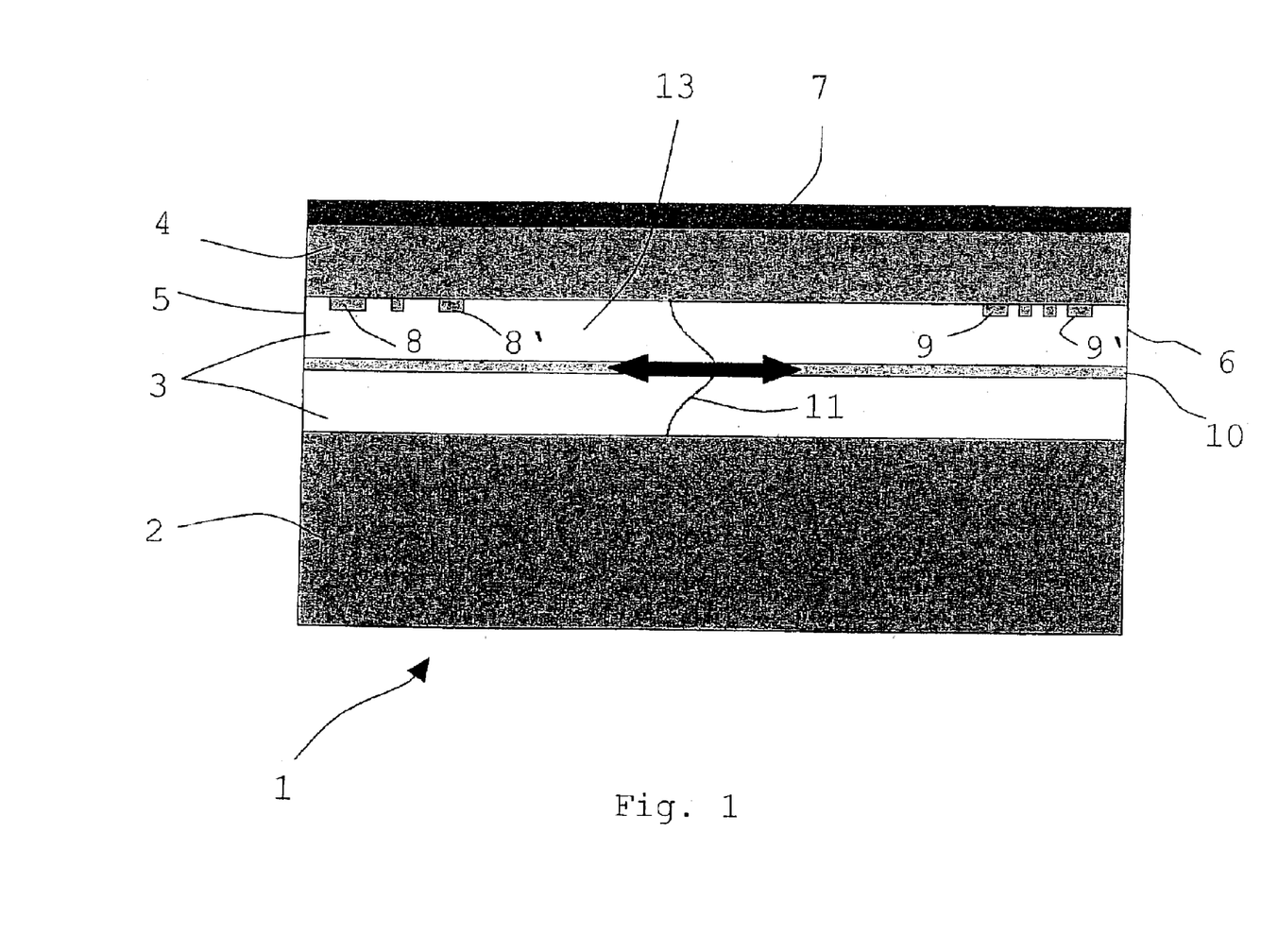
FIG. 1 the schematic construction of a semiconductor laser resonator.

FIG. 1 shows a laser resonator 1 which comprises essentially three layers which are disposed one above the other. These three layers are a substrate 2 (lower cover layer), a waveguide 3 and a superstrate 4 (upper cover layer). The substrate 2 and the superstrate 4 enclose the waveguide 3 and produce totally reflecting interfaces at the interfaces between substrate 2 and waveguide 3 and also waveguide 3 and superstrate 4 so that a mode 11 is operated in the waveguide layer 3.

The waveguide 3 has two plane-parallel facets 5 and 6, facet 5 being mirror-coated and facet 6 representing a partially mirror-coated facet with low reflection. These two facets lead to the construction of a resonator for electromagnetic radiation, one part of the resonator radiation being decoupled as laser beam via the facet 6. Directly next to the two facets 5 and 6 respectively there are situated regions 8, 8', 8" or 9 to 9" in which the waveguide 3 is locally thinned. By means of this thinning, phase structures are produced which lead to increased circulating losses for specific modes of the laser beam 11. As a result, these modes are prevented from oscillating in the laser resonator when the resonator is pumped electrically.

Figure 2:
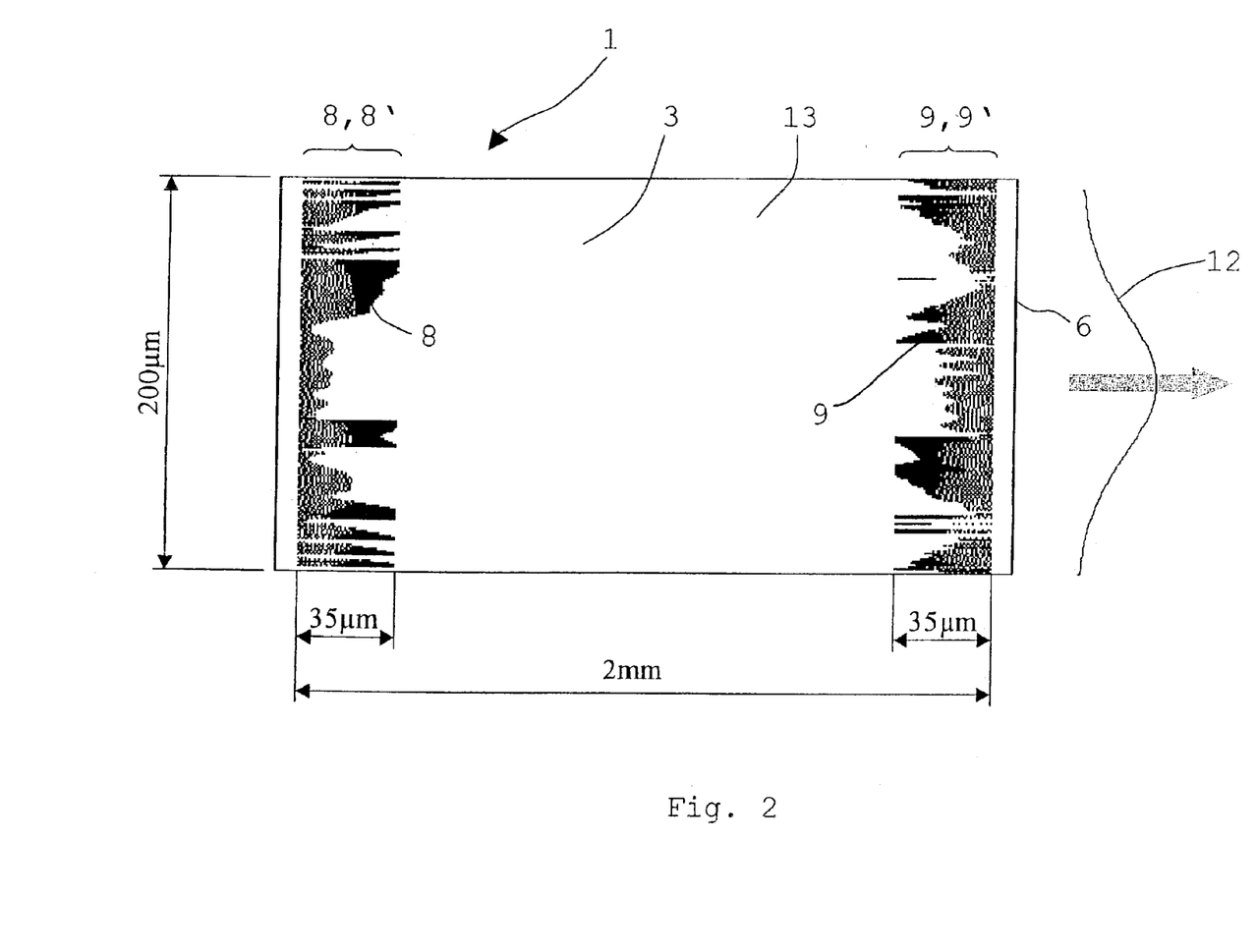
FIG. 2 the distribution of the phase structures in the laser resonator from FIG. 1.

FIG. 2 shows a plan view of the waveguide 3, the local thinning being represented by grey shading. These local thinnings, i.e. the phase structures 8 and 9 produced in the waveguide 3 are calculated such that their effect on the fundamental mode is virtually compensated for whilst they lead to a strong increase in the circulating losses for all further transverse modes.

In the present example, the resonator has a width of 200 $\mu$m and a length of 2 mm. This region is electrically pumped and hence contains the active zone of the semiconductor laser. The thickness of the waveguide which is illustrated in FIG. 1, as is normal in all band semiconductor lasers is chosen such that the electromagnetic field is operated in monomode in the direction of the layer thickness. The local variation of the effective refractive index of the waveguide is effected, as described, by a specific local variation of the thickness of the waveguide, as are illustrated by the hatchings 8 and 9 in FIG. 2. As a result, the effective refractive index of the active layer in the region of the non-structured waveguide is $n_{1,eff}$=3.45, whilst in the region of the thinning it is $n_{2,eff}$=3.42.

The depth of the two structured zones 8 and 9 in longitudinal direction which are located directly in front of the two facets 5 and 6 is respectively maximum 35 $\mu$m.

In the case of this described resonator configuration, the associated fundamental mode has a circulating loss in the resonator of 2.2%. The second mode in the resonator already has a circulating loss of more than 38% and the losses for all further modes are much greater still.

On the basis of this circulating loss distribution between the individual modes, the described laser oscillates only in the fundamental mode so that a Gaussian beam is decoupled from the semiconductor laser at the facet 6, said beam being monomode and having a beam radius of W=65 $\mu$m in a lateral direction.

Figure 8:
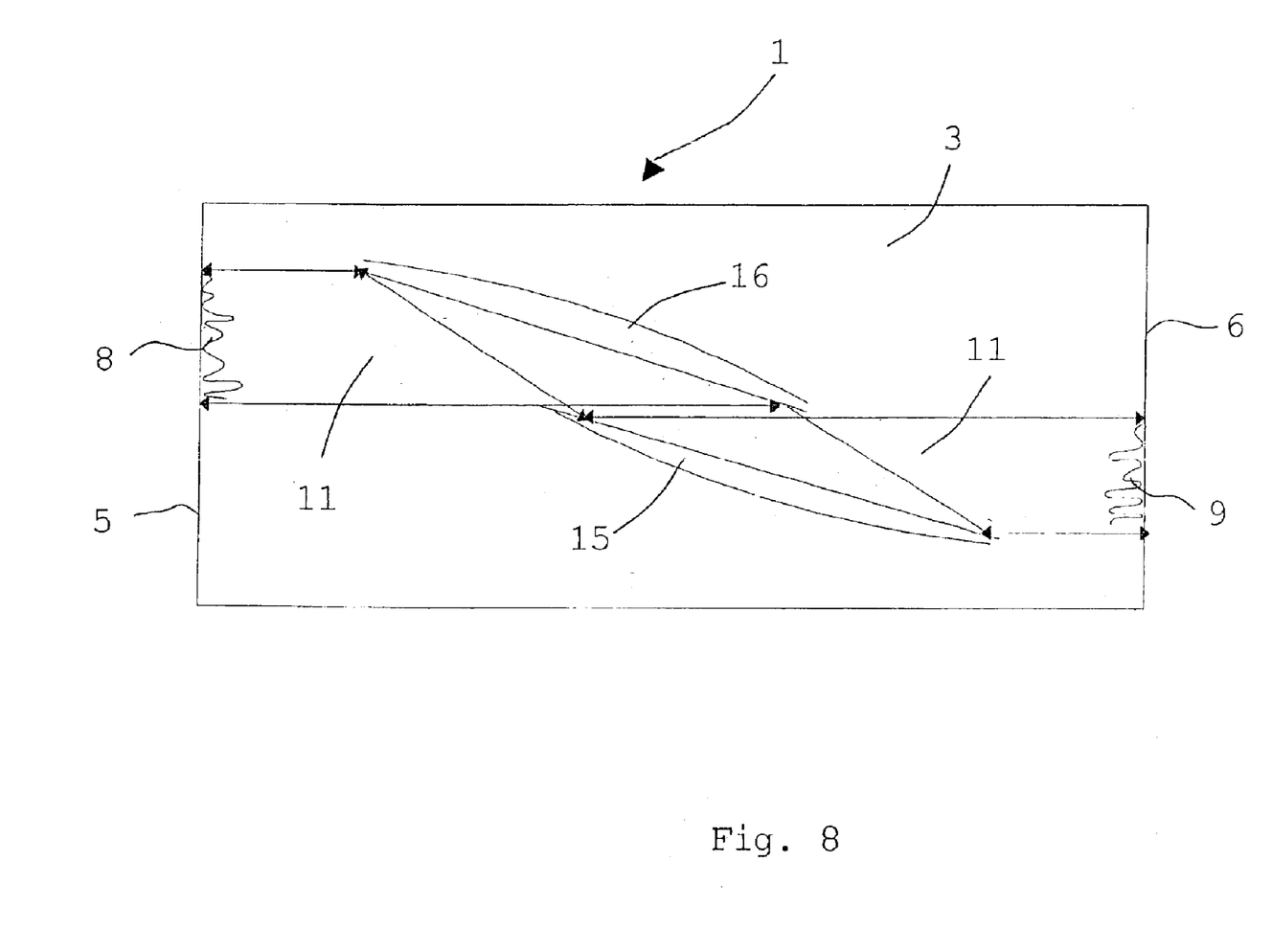
FIG. 8 a further laser resonator according to the invention with integrated mirrors.

The basic idea for arrangement of phase structures in the vicinity of facets with propagation of modes through the waveguide can also be applied when the path of the fundamental mode through direction-changing elements of integrated optics, such as mirrors, prisms or diffractive (holographic) elements is bent in order to increase the mode volume. Such mirrors can be: individual deeply etched channels, Bragg gratings with straight or curved channels, prismatically configured regions of a changed effective refractive index, or else regions of one or both facets which are used in a totally reflecting manner or are totally mirror-coated. In the case of the laser resonator according to FIG. 8, two mirrors 15, 16 in the form of etched channels are placed in the propagation track of the modes so that a double reflection is effected via the total reflection effected thereon. The length of the laser between both facets is 4 mm, the beam width of the mode field 200 μm, the length of the two reflecting channels 15, 16, 2294 μm, the angle of incidence of the fundamental mode towards the mirrors 85°, the reduction in the effective refractive index in the channels Δn=0.02. The distances of the facets 5, 6 up to the respective beginning of the mirror pair 15, 16 are 285 μm and, in front of both facets 5, 6, the regions 8, 9, which are coordinated to each other as described in the main claim, are disposed with varying effective refractive index. The mode selectivity permits the diffraction limit to be achieved in this arrangement which would not be the case without the phase structures 8, 9 according to the invention as Z-lasers.

Figure 9:
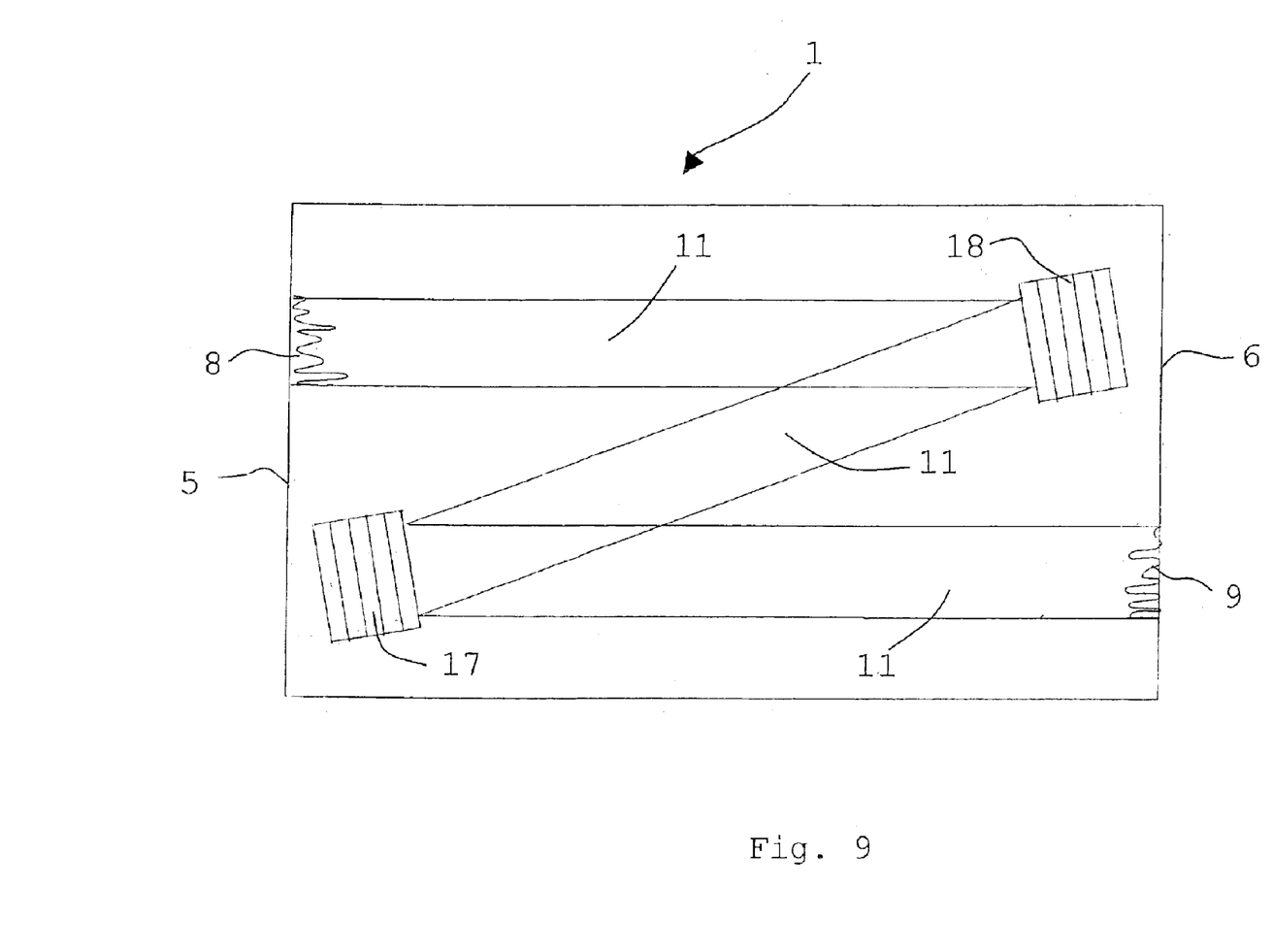
FIG. 9 a further laser resonator according to the invention with Bragg gratings as deflection elements.

In a further example in FIG. 9, the two reflecting channels are replaced by reflective Bragg gratings 17, 18 and the angles of incidence are chosen differently.

Figure 10:
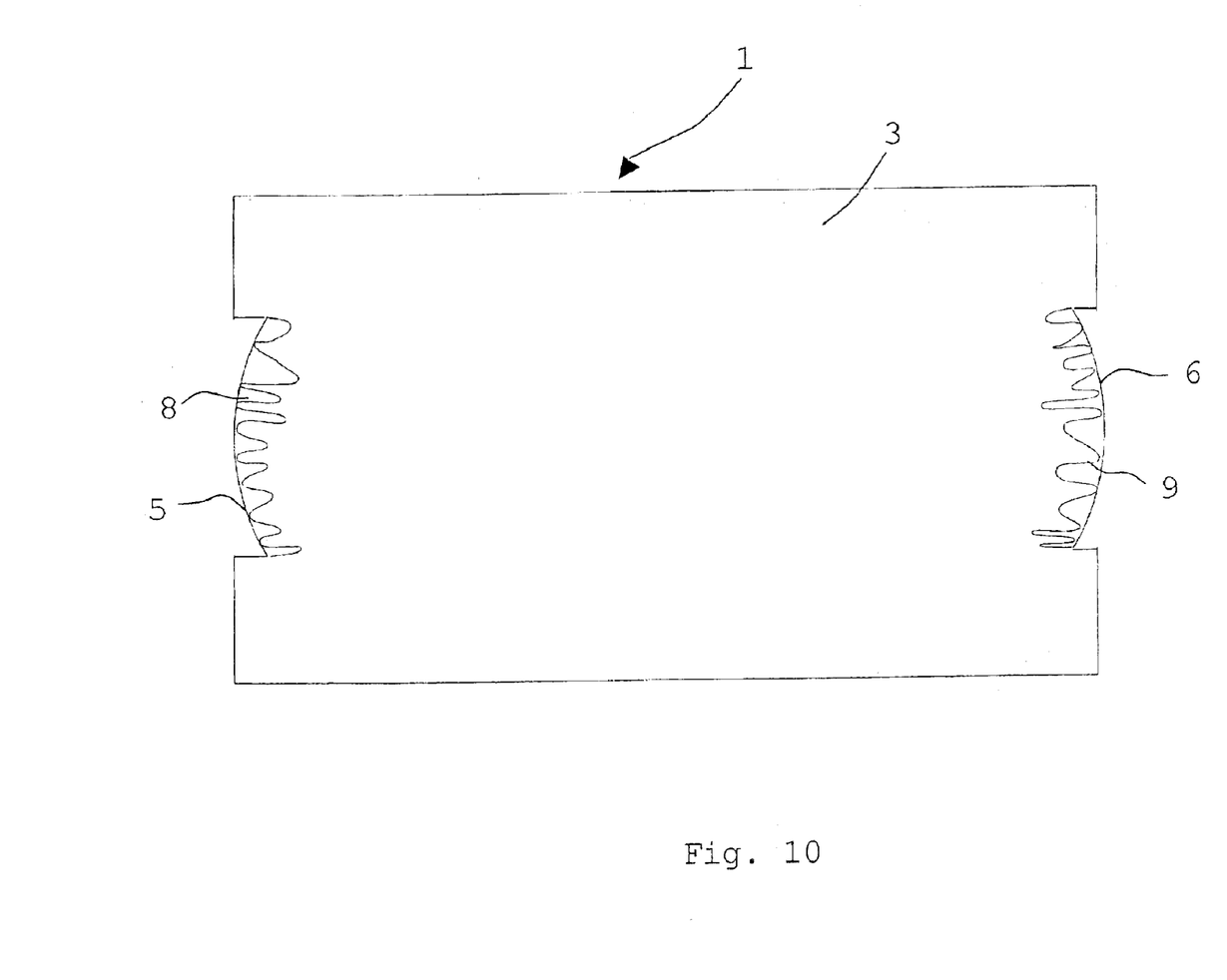
FIG. 10 a further laser resonator according to the invention with curved end facets.

In the example according to FIG. 10, the facets 5, 6 of the resonator are in addition curved which influences the propagation characteristic of the modes in the resonator in addition to the phase structures 8, 9. In this case, the fundamental mode at the facets 5, 6 no longer has a flat wavefront instead the wavefront has the same curve as the respective facet 5, 6.

With reference to FIGS. 3 to 6, a method according to the invention for calculating a laser resonator according to the invention is intended now to be explained. The same or similar reference numbers designate thereby the same or similar elements as in FIGS. 1 and 2, here and subsequently.

Figure 3:
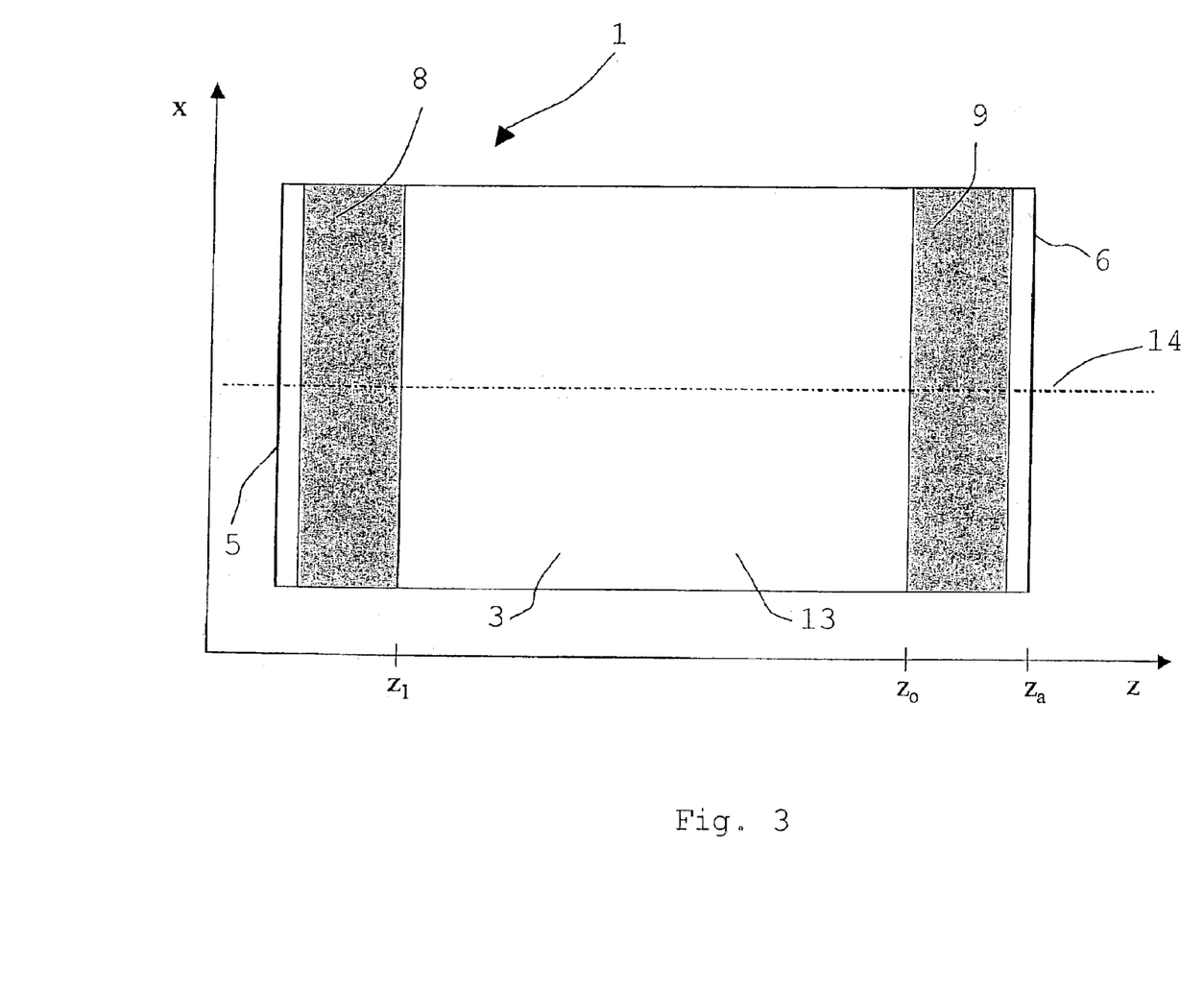
FIG. 3 the construction of a laser resonator according to the invention.

FIG. 3 shows thereby an embodiment of a laser resonator according to the invention in plan view, in particular the regions of the holographic phase elements 8 and 9 being illustrated. These are adjacent to the respective end facets 5 or 6, but being able to maintain a more or less large spacing to these facets. In this sense, adjacent implies here in the present application that respectively one phase element 8 or 9 is assigned to each facet 5 or 6. The phase elements 8 or 9 can thereby be disposed however along the resonator longitudinal axis 14 at any position within the resonator. It is therefore also possible to dispose the phase elements 8, 9 at only a small spacing from each other in the region of the centre between the two end facets 5 or 6. However, the assignment respectively of one phase element 8 or 9 to one end face 5 or 6 is always thereby essential, an internal resonator region 13 remaining between the two phase elements 8 and 9.

Figure 4:
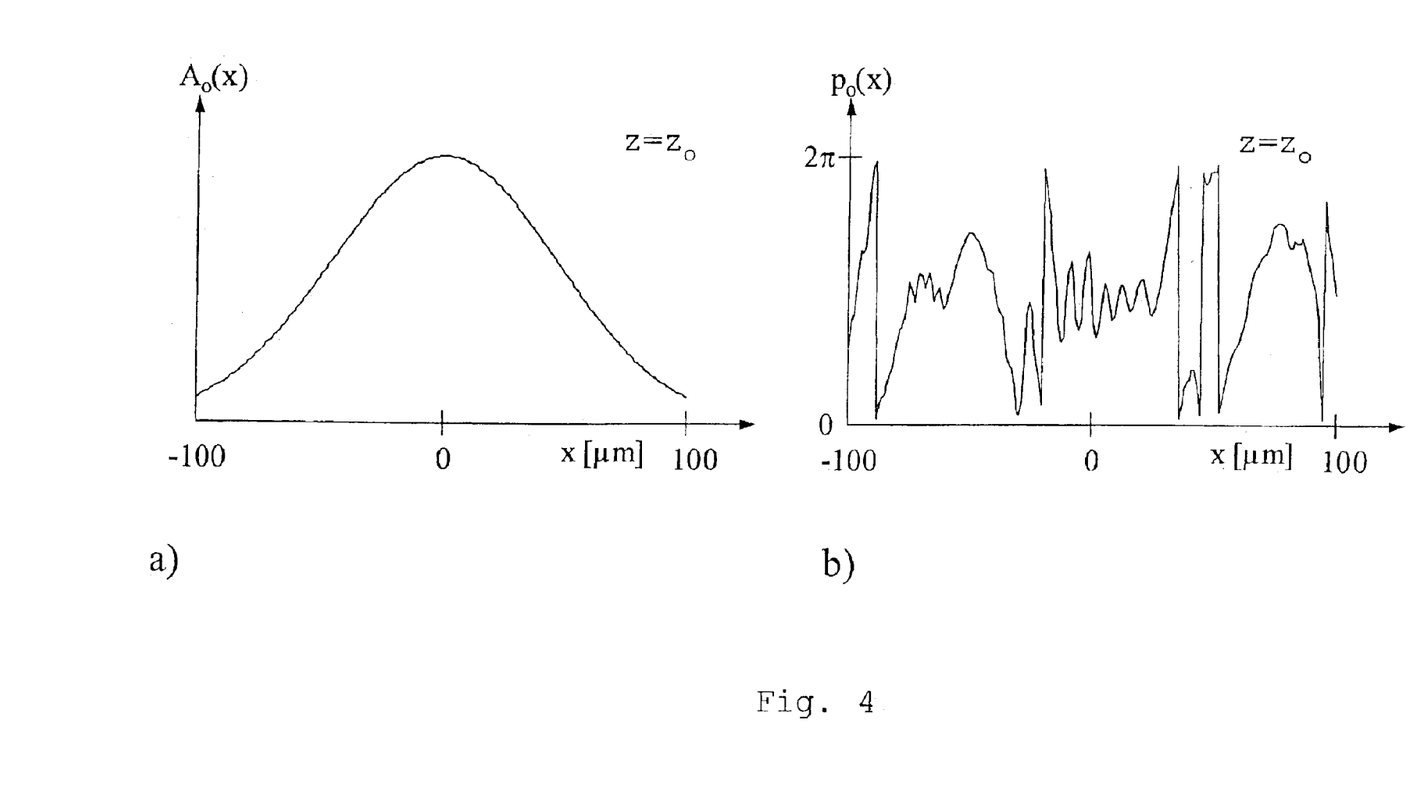
FIG. 4 the amplitude distribution and the phase distribution of a mode to be amplified between the two phase structures.

FIG. 4 shows the amplitude and the phase of the mode selected in the present example and to be amplified at the position $Z_o$ from FIG. 3, i.e. directly before entry into the phase structure 9.

Figure 5:
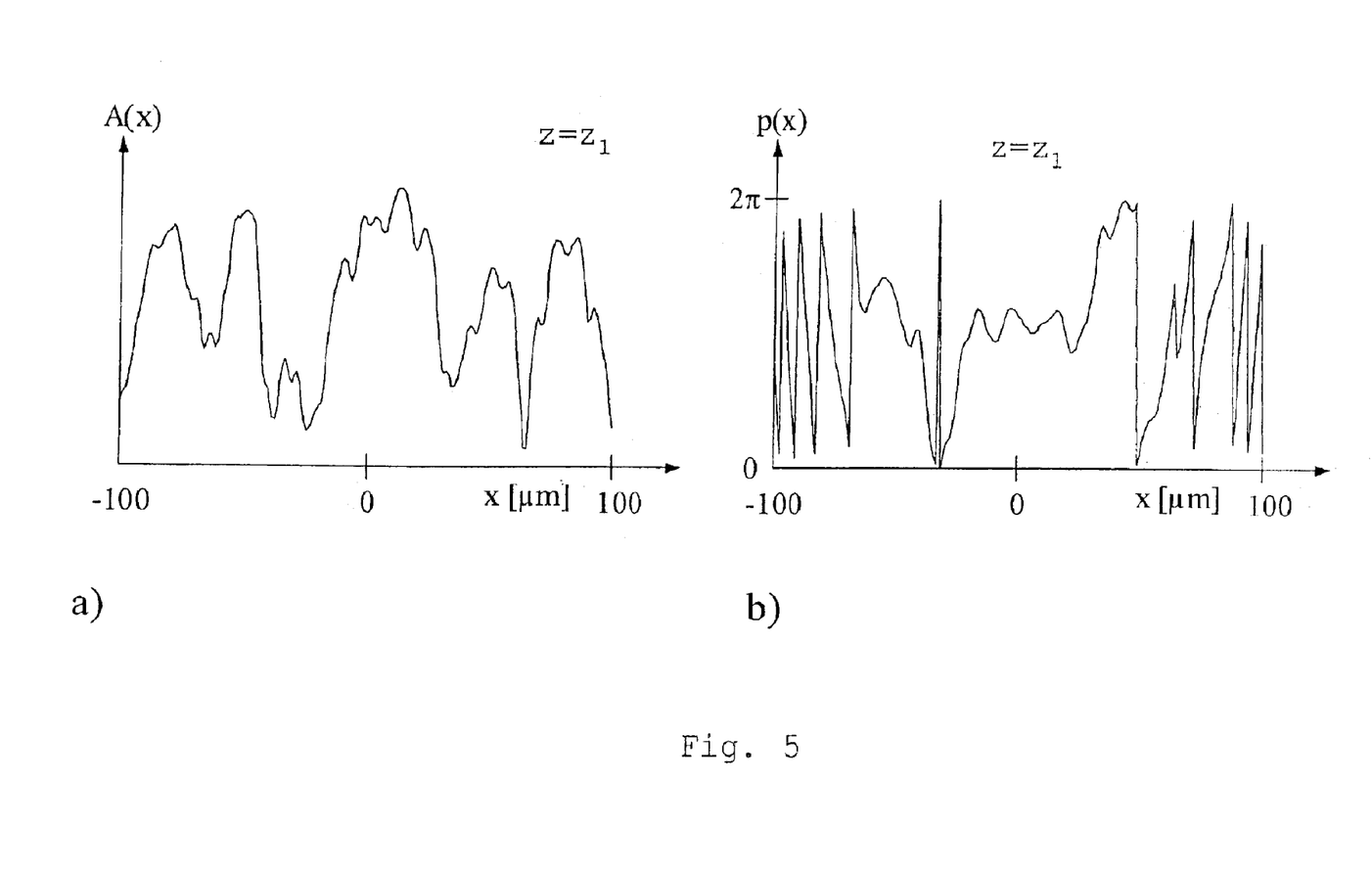
FIG. 5 the amplitude distribution and the phase distribution between the two phase structures in front of the other phase structure relative to FIG. 4.

FIG. 5 shows the corresponding amplitude and phase of the mode to be amplified at the position $Z_1$ from FIG. 3, i.e. directly before entry into the phase structure 8.

Figure 6:
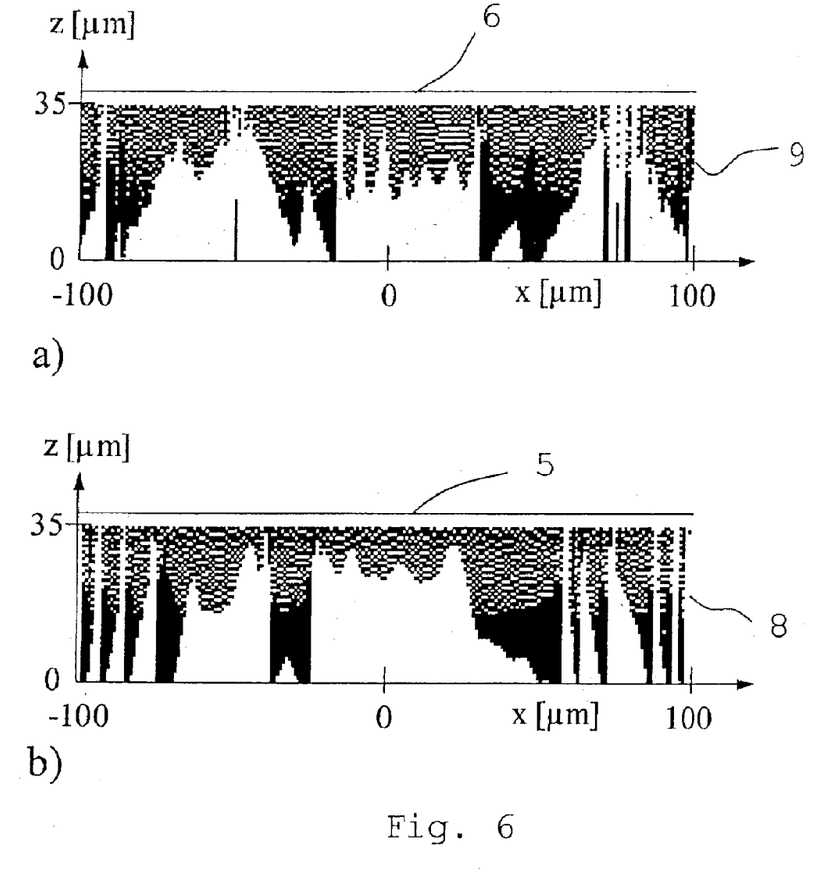
FIG. 6 the structure of the thinned regions of the phase structures in front of the two end facets.

FIG. 6 shows the phase structures i.e. the thinned regions in black directly in front of the decoupling facet 6 (FIG. 6a) or directly in front of the reflecting second facet 5 (FIG. 6b).

The following description of an example of a production method relates now to these FIGS. 3 to 6.

The laser resonator to be calculated should operate at a wavelength λ=1060 nm. The design begins with the specification of a field component of the fundamental mode to be realised (desired)

$$U(x, z_o) = A_o(x) \exp [i^* p_o(x)]$$

of the resonator 1, i.e. with the specification of the one-dimensional lateral amplitudes and phase distribution $A_o(x)$ or $p_o(x)$ in the plane $z_o$. It is thereby assumed that the thickness of the waveguiding layer is dimensioned such that only a lateral mode is operated in y-direction, i.e. the y-dependency of the field component U is not taken into account. In the concrete example, the desired fundamental mode in the plane $z_o$ has the Gaussian amplitude distribution illustrated in FIG. 4a $$A_o(x) = \exp(-x^2/w^2)$$

with the so-called Gaussian radius w=65 μm.

A band-limited random phase is chosen for the wavefront or phase distribution $p_o(x)$, i.e. the phase values vary statistically randomly with the x coordinate, the relation $$f_x < f_{max}$$

for the occurring local frequencies $f_x$ of the chosen phase function being intended to apply (band limitation). In the concrete example, $f_{max}=200$ mm$^{-1}$. FIG. 4b shows the thus calculated phase distribution or wavefront $p_o(x)$ for the concrete example observed here. The position $z_o$ was chosen in the present example such that it is located on the resonator internal side directly next to the holographic phase structure to be calculated in front of the decoupling facet 6.

By means of known BPM algorithms (English: Beam Propagation Method, see for example R. März, Integrated Optics, Artech House Boston 1994), the thus calculated field distribution, taking into account the geometric waveguide parameters, can be numerically propagated through the laterally non-structured internal region 13 of the laser resonator 1, the field distribution U (x, $z_1$) on the resonator internal side directly in front of the second holographic phase structure 8 being retained, said phase structure being located in front of the second resonator facet 5. In the concrete example, the length of the non-structured internal resonator region 13 is 1.93 mm. As FIG. 5 shows, this distribution deviates in its x-dependency very strongly from the distribution U (x, $z_o$) in front of the other phase structure 9, which can be attributed to the strongly modulated phase distribution $p_o$ (x, $z_o$) which significantly influences the propagation properties of the fundamental mode.

In the next step, the calculation of the holographic phase structures 8, 9 in front of the two facets of the resonator is effected. The optical function of these phase structures 8, 9 resides in the fact that, upon single passage of the field distributions U (x, $z_o$) or U (x, $z_1$) through these structures 9, their wavefront is smoothed, i.e. that the phase of the fundamental mode is constant directly in front of the facets 5, 6. The calculation of the concrete form of these phase structures 8, 9 must be effected taking into account their subsequent production as local thinning of the waveguide layer 3. In particular, the thinning should be effected in a binary fashion for reasons of simpler produceability, i.e. there should be only two different waveguide thicknesses in the region of these phase structures 8, 9. The thickness of the waveguiding region 3 and the waveguide material determine the effective refractive index of the waveguide 3. In the concrete case, the effective refractive index in the non-thinned region is $n_{eff}=3.45$, whilst it is $n_{eff}=3.42$ in the region of the thinning. By means of a suitable arrangement of waveguide regions with and without thinning, an influencing of the wavefront form of the resonator modes is therefore possible. In the concrete case, the calculation of the regions to be thinned (of the phase element) is effected by a step-wise propagation (for example in 100 steps) of the field distribution U (x, $z_o$) or U (x, $z_1$) by the phase element 8 or 9, a thinned region being disposed after each step at the positions x at which the phase values of U are smaller than the average of all the phase values. In these regions there is effected correspondingly a reduction in the wavefront deviation from the average value on the basis of the lower effective refractive index. If the extension of these phase elements in z-direction is large enough, then the wavefront of U can be smoothed in this manner during passage through the element or the phase of U is constant along x in front of the facet 5 or 6. During the second passage of U through the element 8 or 9 and reflection therebetween at the facet 5 or 6, the thus calculated phase structure 8 or 9 acts like a phase conjugator [3], i.e. from $$U(x, z_o) = A_o(x) \exp[i^* p_o(x)]$$

in front of the phase structure there is $$U(x, z_o) = A_o(x)[-i^* p_o(x)]$$

after the second passage and reflection at the facet 5 or 6.

The structures of the thinned regions for the concrete design example are illustrated in FIGS. 6a and 6b.

The concluding design step comprises the analysis of the circulating losses for the fundamental mode and the higher excited modes of the resonator 1 calculated according to the described specification. These can be effected for example by means of the so-called Fox-Li-Algorithm, A. Fox, T. Li, "Resonant Modes in a maser interferometer", Bell Syst. Techn. J. 40, pp. 453–488, March 1961. For the concrete example, there is obtained a circulating loss for the fundamental mode of 2.2% and for the second excited mode a circulating loss of 38%. The value of the circulating losses for the higher modes is thereby determined by the strength of the phase modulation of the prescribed distribution $p_o(x)$. A precise prediction of the circulating losses for the individual resonator modes dependent upon the form of the function $p_o(x)$ cannot be made. In general it applies however that, upon strong modulation, the circulating loss increases for the higher resonator modes. In the design of a concrete resonator 1, an optimisation of the ratios of the circulating losses between fundamental mode and first excited mode are produced by means of known methods (for example genetic optimisation algorithms, F. Herrera, J. L. Verdegay, Genetic Algorithms and Soft Computing (Studies in Fuzziness and Soft Computing Vol. 8), Physica-Verlag Heidelberg, (1996). Restrictions in the produceable modulation form are produced from the produceable lateral phase distributions (thinnings of the waveguide) and from the total extension of the waveguiding region in x-direction (width of the resonator), since an increase in the modulation also leads to a widening of the field distribution U (x, $z_1$) in front of the second facet which naturally may not be greater than the resonator width in order not to introduce additional losses for the fundamental mode.

Figure 7:
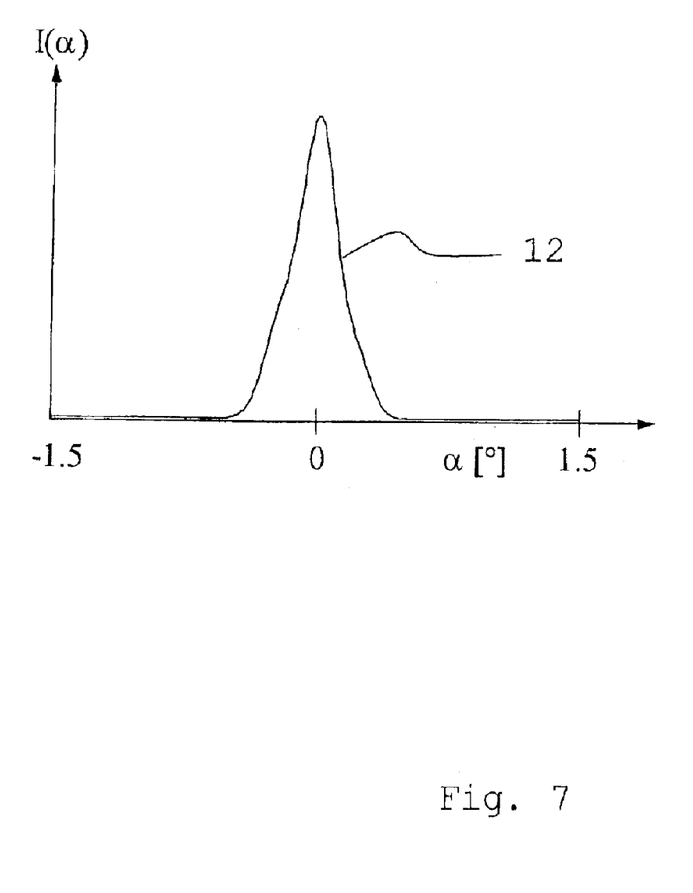
FIG. 7 the intensity distribution of the decoupled fundamental mode in the Fraunhofer region of the laser.

FIG. 7 shows the Fraunhofer region intensity distribution of the emitted fundamental mode of the resonator calculated in the example which deviates only slightly from that of an ideal Gaussian profile.

In summary, it can be established that, by means of the phase structures according to the invention in semiconductor laser resonators, even conventional semiconductor laser resonators with a large lateral extension can be changed in order to achieve high laser intensities such that these oscillate merely with a desired number in the waveguide plane of lateral modes, for example only of the fundamental mode, and thus monomode or specifically influenced multimode laser beams are produced.

What is claimed is:

1. Laser resonator for semiconductor lasers having a waveguide layer for a laser mode to be amplified which extends between a substrate layer and a superstrate layer and which is limited at two oppositely situated sides in extension direction of the waveguide layer by a first and a second end facet as resonator end faces, the two end faces establishing the propagation direction of the laser mode to be amplified, wherein the laser resonator between the two end facets has a first phase structure adjacent to the first end facet and a second phase structure adjacent to the second end facet, which vary locally in the plane of the waveguide layer in such a manner that at least one predetermined lateral laser mode in the plane of the waveguide layer and perpendicular to its propagation direction is phase-conjugated during passage through respectively one of the two phase structures, reflection at the adjacent end facet and repeated passage through the same phase structure, and the phase structures being configured in such a manner that a predetermined lateral laser mode is phase-conjugated during passage through the phase structure, reflection at the adjacent end facet and repeated passage through the same phase structure, which mode has, in the intermediate region between the first and the second phase structure, a strongly non-periodic varying phase front in the plane of the waveguide layer and laterally relative to the wave propagation direction.

2. Laser resonator according to claim 1, wherein at least one phase structure has a two-dimensionally varying refractive index in the plane of the waveguide layer.

3. Laser resonator according to claim 2, wherein the substrate, the waveguide layer and/or the superstrate have as phase structure a two-dimensionally varying refractive index in the plane of the waveguide layer.

4. Laser resonator according to claim 2, wherein for small variations Δn of the effective calculation index n with Δn/n<0.1 in the said phase structures, the effective extension of these phase structures in propagation direction of the laser mode to be amplified is greater than Δn/n, λ being the wavelength of the laser radiation in air.

5. Laser resonator according to claim 1, wherein at least one of the phase structures has a two-dimensionally locally varying thickness of the waveguide layer in the plane of the waveguide layer.

6. Laser resonator according to claim 5, wherein the waveguide layer adopts two different thicknesses in the region of the phase structures.

7. Laser resonator according to claim 1, wherein the waveguide layer has furthermore at least one radiation-deflecting structure which deflects the beam circulating in the waveguide layer.

8. Laser resonator according to claim 7, wherein the deflecting structure is a mirror, a prism and/or a diffractive element.

9. Laser resonator according to claim 7, wherein the deflecting structure has a deeply etched channel, a Bragg grating with straight or curved grating channels, a prismatically configured region of the effective refractive index and/or a totally reflecting or totally mirror-coated region.

10. Laser resonator according to claim 7, wherein the deflecting structure is part of one of the end facets or is disposed between the two phase structures.

11. Laser resonator according to claim 7, wherein the waveguide layer has at least one reflecting structure as beam-deflecting structure, said reflecting structure deflecting the beam circulating in the wave guide layer.

12. Laser resonator according to claim 11, wherein at least one reflecting structure has a channel with a width of the multiple of the wavelength of the circulating beam and a high effective refractive index difference in total reflection to adjacent regions.

13. Laser resonator according to claim 12, wherein the channel width varies locally.

14. Laser resonator according to claim 11, wherein the at least one reflecting structure has a Bragg grating which is disposed in such a manner that the circulating beam impinges on the grating channels at a non-perpendicular angle of incidence.

15. Laser resonator according to claim 1, wherein the end facets are planar or curved.

16. Laser resonator according to claim 1, wherein the predetermined laser mode has a constant phase in the waveguide plane along the end facets.

17. Laser resonator according to claim 1, wherein the wavefront of the predetermined laser mode has the same curve as the end facet in the waveguide plane along the end facet.

18. Laser resonator according to claim 1, wherein the thickness of the wave guide layer is dimensioned such that perpendicularly to the plane of the waveguide layer only one lateral mode is amplified and occurs or is guided.

19. Laser resonator according to claim 1, comprising strip electrodes adjacent to the wave guide layer for pumping the laser resonator which electrodes are disposed at a spacing from the end facet in such a manner that they do not overlap the phase structures.

20. Method for producing a laser resonator according to claim 1, wherein for the predetermined mode of the laser beam to be amplified, at one position in the region between two phase structures, a predetermined one-dimensionally lateral amplitude or phase distribution ($A_0(x)$ or $p_o(x)$) of the wavefront, which extends in the plane of the waveguide layer, is prescribed, and the propagation of this mode between the two end facets is determined, and the phase structures being determined in front of the two end facets such that the predetermined lateral phase distribution of the mode is constant after passing through each of the phase structures in the waveguide plane along the end facets.

21. Method according to claim 20, wherein a non-periodic phase distribution is prescribed as predetermined local phase distribution of the predetermined mode.

22. Method according to claim 20, wherein a random phase distribution is prescribed as predetermined lateral phase distribution of the predetermined mode.

23. Method according to claim 20, wherein a laterally statistically varying phase distribution in the waveguide plane is prescribed as predetermined lateral phase distribution.

24. Method according to claim 20, wherein a phase distribution with band-limited local frequencies is prescribed as predetermined lateral phase distribution.

25. Method according to claim 20, wherein the lateral modulation of the wavefront p(x) of the electrical field of the fundamental mode with the amplitude distribution A(x) in the direction x perpendicular to the resonator axis U (x, z)=A(x)*exp (i*p (x)] in the resonator cross-section of the effective refractive index distribution close to the light outlet end facet of the resonator is prescribed such that it is described with a function p (x) with at least five non-identical turning points, the minimal phase deviation between adjacent turning points being $0.1\pi$.

26. Method according to claim 20, wherein in order to determine one of the phase structures in sections starting from the region between the two phase structures in the propagation direction of the mode in the direction towards the end facet adjacent to the phase structure, the following steps are implemented:
   a) determining the lateral phase distribution of the predetermined mode at a specific position in the propagation direction of the mode and therefrom those regions in lateral direction of the phase distribution in which the phase deviates from the average phase in a prescribed manner;
   b) providing a portion with changed refractive index of the waveguide layer, of the substrate and/or of the superstrate adjacent to the specific position with predetermined extension in propagation direction of the mode in those regions with a deviating phase in such a manner that during passage of the mode through a thus determined region with changed refractive index, the deviation of the phase is counteracted by the average phase;
   c) calculation of the propagation of the mode along the mentioned portion in propagation direction of the mode up to the end of the mentioned portion;
   d) repetition of the steps a) to c) for the end of the portion as predetermined position until the phase distribution determined in step a) in lateral direction is constant or sufficiently constant according to a predetermined cut-off criterion; and
   e) production of a laser resonator with the phase structure determined in the steps a) to d).

27. Method according to claim 26, wherein those regions are determined in step a) in which the phase is smaller than the average phase and the corresponding regions are provided with a lower effective refractive index in step b).

28. Method according to claim 26, wherein the corresponding regions are configured as thinned regions in step b).

29. Method according to claim 26, wherein a common or two different threshold values are provided for the determination of the deviation of the phase in step a) and also for the cut-off criterion in step d).

30. A method according to claim 20, wherein the circulating losses of the predetermined mode and also of all further modes circulating in the resonator are determined after determination of the phase structures.

31. A method according to claim 20, wherein the lateral phase distribution of the mode to be amplified is optimized in a conventional manner.

32. Method according to claim 20, wherein the propagation of the mode between the end facets is determined by means of a wave optical beam propagation method, in particular a BPM method ("Beam Propagation Method").

33. A method according to claim 31, wherein the lateral phase distribution of the mode to be amplified is optimised by at least one of: genetic optimization methods, a low circulating loss of the mode to be amplified, high circulating losses of the further modes circulating in the resonator and/or the ratio of these circulating losses being used as optimization criteria.

* * * * *